United States Patent [19]

Araki et al.

[11] Patent Number: 5,089,238
[45] Date of Patent: Feb. 18, 1992

[54] METHOD OF FORMING A TEMPERATURE PATTERN OF HEATER AND SILICON SINGLE CRYSTAL GROWTH CONTROL APPARATUS USING THE TEMPERATURE PATTERN

[75] Inventors: Kenji Araki; Akiho Maeda, both of Takehu; Masahiko Baba, Annaka, all of Japan

[73] Assignee: Shin-Etsu Handotai Company, Limited, Tokyo, Japan

[21] Appl. No.: 601,096

[22] Filed: Oct. 22, 1990

[30] Foreign Application Priority Data

Oct. 20, 1989 [JP] Japan .................. 1-237517

[51] Int. Cl.$^5$ .............................................. C30B 15/28
[52] U.S. Cl. ..................................... 422/249; 156/601; 156/617.1; 156/618.1; 156/620.4; 156/DIG. 98; 156/DIG. 115; 422/245; 422/248
[58] Field of Search ............... 156/601, 617.1, 618.1, 156/620.4, DIG. 98, DIG. 115; 422/245, 248, 249

[56] References Cited

U.S. PATENT DOCUMENTS

| | | | |
|---|---|---|---|
| 3,617,392 | 11/1971 | Locke | 23/273 |
| 3,958,129 | 1/1976 | Clement et al. | 156/601 |
| 4,014,656 | 3/1977 | Leibenzeder et al. | 156/601 |
| 4,185,076 | 1/1980 | Hatch et al. | 156/601 |
| 4,242,589 | 12/1980 | Sachs | 156/601 |
| 4,277,441 | 1/1981 | Sachs | 156/601 |
| 4,565,598 | 1/1986 | Seymour | 156/601 |
| 4,794,263 | 12/1988 | Katsuoka et al. | 156/601 |

FOREIGN PATENT DOCUMENTS

| | | |
|---|---|---|
| 142415 | 5/1985 | European Pat. Off. |
| 294311 | 12/1988 | European Pat. Off. |
| 307186 | 12/1988 | Japan |

OTHER PUBLICATIONS

Hull, E. M. et al., "Monitoring Diameter of Semiconductor Crystals During Automated Growth", *IBM Technical Disclosure Bulletin*, vol. 19, No. 3, Aug. 1976, pp. 869-870.

Moody, J. W. et al., "Developments in Czochralski Silicon Crystal Growth", *Solid State Technology*, vol. 26, (1983) Aug., No. 8, pp. 221-224.

"Automatic Czchralski Growth, Growth Parameter Measurements and Process Control", Wuelhoff, *Journal of Crystal Growth*, 65(1983), pp. 278-279.

*Primary Examiner*—Robert Kunemund
*Assistant Examiner*—Fehisa Garrett
*Attorney, Agent, or Firm*—Browdy and Neimark

[57] ABSTRACT

Used in an apparatus for pulling a Si single crystal 36 up from Si molten liquid 35 by using the Czochralski method. In order to produce a Si single crystal having a desired quality, the diameter of the Si single crystal is controlled by controlling the pull-up speed of the Si single crystal, the sum of a reference temperature set value $T_B(X)$, which is a function of a pull-up distance X of the Si single crystal from a certain growth point, and a value proportional to a diameter deviation $\Delta D$ is regarded as a reference temperature, and electric power supplied to a heater (24) for heating the Si molten liquid is controlled so that the temperature of the vicinity of the heater is equal to the reference temperature. In order to easily and quickly set the temperature pattern, various operational data in producing a Si single crystal is automatically collected and stored in a magnetic memory disk (82) corresponding to quality data of the Si single crystals which have been produced, data similar to the quality of a Si single crystal to be produced is retrieved from the stored data, an operator selects the most similar data, the selected operational data is displayed in a display unit (80), and the operator sets the reference temperature pattern $T_B(X)$ on a screen of the display unit by using a mouse (78).

8 Claims, 5 Drawing Sheets

METHOD OF FORMING A TEMPERATURE PATTERN OF HEATER AND SILICON SINGLE CRYSTAL GROWTH CONTROL APPARATUS USING THE TEMPERATURE PATTERN

BACKGROUND OF THE INVENTION

1. Field of the Invention

The present invention relates to a method of forming a temperature pattern with respect to time or progress in process of a heater for heating and melting silicon (Si) for use in a Si single crystal producing apparatus using the Czochralski method, and to a Si single crystal growth control apparatus using the temperature pattern.

2. Description of Prior Art

In recent years, with the high integration and the diversification of semiconductor devices, specifications on the quality of a semiconductor single crystal requested from device manufacturers have become diversified.

On the other hand, when a Si single crystal is pulled up from Si molten liquid in a quartz crucible in the Czochralski method, it is necessary to change various production conditions, such as the rotational speed of the crucible, the temperature of a heater and the pull-up speed and the rotational speed of a Si single crystal pulling shaft, in order to meet the specifications.

However, if one production condition is changed, since the change has a complicated influence on other production conditions, the control of the shape and quality of the Si single crystal becomes extremely complicated.

For example, if the rotational speed of the crucible is increased, the reaction between the Si molten liquid and the quartz crucible is increased and the amount of oxygen to be taken into the Si single crystal is increased. However, if the temperature of the Si molten liquid is raised, the reaction between the Si single crystal and the quartz crucible is also increased and the amount of oxygen to be taken into the Si single crystal is increased. Furthermore, if the rotational speed of the crucible is increased, the temperature of the growing portion of the Si single crystal is lowered by the convection of the Si molten liquid and the growing speed of the Si single crystal is increased. Furthermore, if the temperature of the Si molten liquid is lowered, the growing speed of the Si single crystal is increased and the diameter of the Si single crystal becomes longer. However, if the pull-up speed of the Si single crystal is decreased, the diameter of the Si single crystal also becomes longer.

Therefore, it is necessary to conduct the feedback of many experimental facts (enormous data) to the control through human judgement. This operation is troublesome and takes much time.

Although such a problem will be solved by using a non-Neumann neurocomputer in the future, it is not yet practical at present.

SUMMARY OF THE INVENTION

With such a problem in view, an object of the present invention is to provide a method of forming a temperature pattern with respect to time or progress in process of a heater and a Si single crystal growth control apparatus using the temperature pattern in order to produce a Si single crystal which meets requested specifications in a relatively simple manner and in a short time.

In order to achieve the above object, a Si single crystal growth control apparatus of the present invention has a device for taking a picture of the vicinity of a growing portion of the Si single crystal and outputting image signals, a device for processing the image signals and measuring the diameter $D_i$ of the Si single crystal growing portion, a device in which a reference pattern $D_0(X)$ of the diameter is set as a function of a pull-up distance X from a certain growth point of the Si single crystal, a motor for pulling the Si single crystal up, a means for controlling the rotational speed of the motor so that the deviation of the diameter approaches zero, a means for detecting the temperature representing the temperature of a heater which heats and melts Si in a crucible, a means for controlling electric power to be supplied to the heater so that the detected temperature approaches to a reference temperature, a means in which a temperature pattern $T_B(X)$ is set as a function of the pull-up distance X, and a means for supplying the sum of a value related to the deviation $\Delta D$ of the diameter, such as a n-order function value of $\Delta D$, and an output value of the temperature pattern setting means as the reference temperature to the electric power controlling means.

If the diameter of the Si single crystal is controlled by only the pull-up speed of the Si single crystal, since the response speed is too high, a first problem arises: a body of the Si single crystal is distorted and not cylindrical.

On the other hand, when the temperature of the Si molten liquid is lower, the growing speed of the Si single crystal is higher, and when the temperature of the Si molten liquid is higher, the growing speed of the Si single crystal is lower. Furthermore, the responsiveness of the diameter control by the temperature of the Si molten liquid is slower than that of the diameter control by the pull-up speed of the Si single crystal. Therefore, by controlling the temperature of the molten liquid as well as the pull-up speed of the Si single crystal, it is possible to accurately control the diameter of the Si single crystal, to make the body substantially cylindrical, and to solve the first problem.

In general, the electric power to be supplied to the heater is controlled by supplying the control deviation of the diameter of the Si single crystal to a temperature adjuster in the same manner as in controlling the pull-up speed of the Si single crystal.

However, for example, the amount of oxygen melted from the quartz crucible into the Si molten liquid and the amount of oxygen taken into the Si single crystal depend upon the contacting area of the quartz crucible and the Si molten liquid (that is, the amount of the Si molten liquid or the pull-up amount of the Si single crystal), the temperature of the Si molten liquid and the rotational speed CR of the quartz crucible. Since the convection of the Si molten liquid is changed by the rotational speed CR, with a change in the rotational speed CR, the temperature distribution on the crystal growing interface is changed and the growing speed of the Si single crystal is changed. Therefore, when the electric power supplied to the heater is simply controlled, a second problem arises: it is difficult to obtain a Si single crystal having a desired quality.

On the other hand, when the temperature of the Si molten liquid is made higher than the present temperature thereof, regardless of the value of the present temperature, the growing speed of the Si single crystal is lowered, and when the temperature is made lower than the present value, the speed is increased.

The present invention solves the second problem by providing a fixed temperature pattern regarding the reference temperature of the heater, and solves the first problem by raising and lowering the temperature based on the temperature pattern. In other words, the temperature of the heater is divided into a fixed temperature pattern element and a variable element, and both elements are used for different purposes, that is, two-dimensionally. Such a usage can be realized by making the variable element smaller than the fixed pattern. Furthermore, the shape and quality of the Si single crystal can be controlled extremely simply by the usage, that is, by the Si single crystal growth control apparatus of the present invention.

If a means for outputting a value manually set is additionally mounted in the above Si single crystal growth control apparatus, and the reference temperature supply means supplies the sum of a value related to the deviation of the diameter and a value output from the temperature pattern setting means as the reference temperature to the electric power control means, when the deviation of the diameter of the Si single crystal becomes large in an automatic control operation, the judgement of an operator can be provided, and the Si single crystal can be formed in a substantially desired shape.

A method of the present invention for forming the temperature pattern of the heater includes the following steps: (1) automatically collecting various operational data in producing a Si single crystal by using the above apparatus; (2) storing the collected data and data related to the quality of the Si single crystal in a memory device; (3) retrieving data similar to the quality of a Si single crystal to be produced from the stored data by using a computer; (4) displaying the retrieved data on a screen of a display unit for an operator to select data most similar to the quality from the displayed data; (5) displaying details of the selected data in a graph on the screen for setting a temperature pattern; and (6) letting the operator set the temperature pattern while watching the setting screen.

According to this method, the operation for setting the temperature pattern in order to finally adjust the production conditions so as to meet the requested specifications can be facilitated and the production conditions of the Si single crystal to meet the requested specifications can be determined in a short time and in a relatively simple manner.

Since the setting operation of the temperature pattern is carried out based on experimental facts, if a temperature pattern $T_B(X)$ is displayed in a graph by setting a plurality of coordinates $(X, T_B)$ constituting the temperature pattern with a mouse in the Step 6, the setting operation becomes ever easier.

BRIEF DESCRIPTION OF THE DRAWINGS

FIGS. 1 to 5 are illustrations of an embodiment of the present invention:

DESCRIPTION OF THE PREFERRED EMBODIMENT

An embodiment of the present invention will now be described with reference to the accompanying drawings. Although only production of a body, which is the most important part of a Si single crystal, is described in this embodiment, the production of a conical portion and a tail portion which are disposed ahead of and in succession to the body respectively is the same as that of the body.

Figure 1:
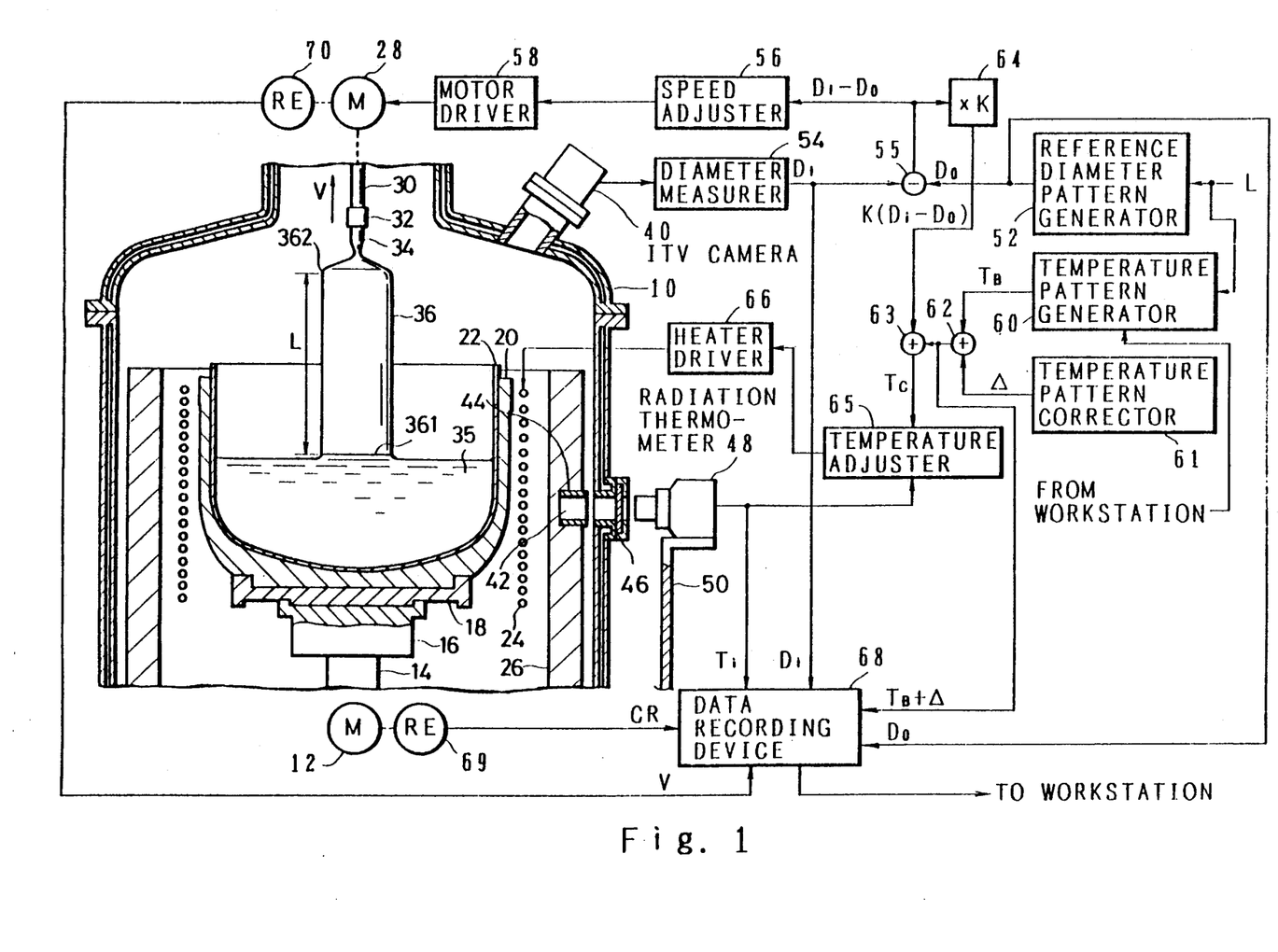
FIG. 1 is a schematic sectional view showing the composition of a main part of a Si single crystal pulling apparatus and a block diagram of the control system.

FIG. 1 shows a main composition of a Si single crystal pulling apparatus using the Czochralski method.

In a chamber 10, a pedestal 16 is formed at the top end of a crucible rotating shaft 14 which is rotated by a motor 12, and a graphite crucible 20 is laid on the pedestal 16 through a table 18. A quartz crucible 22 is fitted into the graphite crucible 20. The graphite crucible 20 is surrounded by a heater 24 and the heater is surrounded by a heat-insulating graphite tube 26.

On the other hand, a seed crystal 34 is retained by a holder 32 at the bottom of a pulling shaft 30 which is elevated by a motor 28. A Si single crystal 36 is produced by heating and melting Si polycrystals in the quartz crucible 22, dipping the lower end of the seed crystal 34 in Si molten liquid 35, and pulling the seed crystal 34 up.

The crucible rotation shaft 14 is elevated by an unillustrated motor, thereby normally maintaining a fixed level of the Si molten liquid 35 in producing the Si single crystal 36.

An ITV camera 40 is fixed on a window 38 mounted on a shoulder portion of the chamber 10 and takes a picture of the vicinity of a crystal growing interface 361 between the Si molten liquid 35 and the Si single crystal 36. Furthermore, a hole 42 is formed on the peripheral surface of the heat-insulating graphite tube 26 and a reinforcing tube 44 is fitted into the hole 42. Corresponding to the hole 42, a window 46 is formed on a body of the chamber 10, and a radiation thermometer 48 is fixed at the upper end of a bracket 50, whose lower end is fixed, corresponding to the window 46 outside of the chamber 10. The radiation thermometer 48 indirectly detects the temperature of the heater 24 by detecting heat rays radiated from the bottom plane of the hole 42.

The reference diameter $D_0$ at the crystal growing interface 361 is set in a reference diameter pattern generator 52 as a function of the length L between the crystal growing interface 361 of the Si single crystal 36 and a leading point 362 of the body (the diameter is constant in the body). The length L of the body is calculated by an unillustrated composition using the initial level of the surface of the Si molten liquid 35, the diameter of the quartz crucible 22, the detected diameter $D_i$ at the crystal growing interface 361, the pull-up distance of the pulling shaft 30 and the pull-up distance of the crucible rotating shaft 14, and supplied to the reference diameter pattern generator 52. On the other hand, image signals output from the ITV camera 40 are supplied to a diameter measurer 54. The diameter measurer 54 performs image processing and detects the diameter $D_i$ at the crystal growing interface 361. The reference diameter $D_0$ and the detected diameter $D_i$ are supplied to a subtracter 55, and the output $(D_0 - D_i)$ of the subtracter 55 is supplied to a speed adjuster 56 as a control deviation. The speed adjuster 56 controls the rotational speed of the motor 28 through a motor driver 58 so that the control deviation approaches 0.

However, in reality, it is difficult to form the Si single crystal 36 in a desired shape by only this control. In other words, the body of the Si single crystal 36 is distorted and is not cylindrical by only this control.

Since the temperature of the Si molten liquid 35 is related to the crystal growing speed, it is possible to make the shape of the body similar to a cylinder by controlling the temperature so as to control the diameter of the Si single crystal 36 more accurately. This is because the growing speed of the Si single crystal 36 is high when the temperature of the Si molten liquid 35 is low, and the growing speed of the Si single crystal 36 is low when the temperature is high, and because the responsibility of the diameter control by the temperature of the Si molten liquid 35 is slower than that of the diameter control by the pull-up speed of the Si single crystal 36.

In general, the electric power to be supplied to the heater 24 is controlled by supplying the diameter control deviation $(D_0 - D_i)$ of the Si single crystal 36 to a temperature adjuster 65 in the same manner as the control of the pull-up speed of the pulling shaft 30.

However, for example, the amount of oxygen melt from the quartz crucible 22 into the Si molten liquid 35 and the amount of the oxygen taken into the Si single crystal 36 depend upon the contact area between the quartz crucible 22 and the Si molten liquid 35, the temperature of the Si molten liquid 35 and so on. The contact area depends upon the length L of the body of the Si single crystal 36 and the rotational speed CR of the quartz crucible 22. Since the convection of the Si molten liquid 35 changes in accordance with the rotational speed CR, the rotational speed CR makes the temperature distribution at the crystal growing interface 361 and the growing speed of the Si single crystal 36 change. Therefore, even if the electric power supplied to the heater 24 is simply controlled as described above, it is difficult to obtain the Si single crystal 36 having a desired quality.

On the other hand, the growing speed of the Si single crystal 36 will be lowered when the temperature of the Si molten liquid 35 is made higher than the present value thereof and will be increased when the temperature is lowered.

This embodiment divides the temperature of the heater 24 into a fixed temperature pattern element and a variable element and uses both elements for different purposes, that is, two-dimensionally. Such a usage can be realized by making the variable element smaller than the fixed pattern element. Furthermore, this usage can facilitate the control of the shape and quality of the Si single crystal to a great extent.

In order to achieve the above object, an output $T_B$ of a temperature pattern generator 60 and an output $\Delta$ of a temperature pattern corrector 61 are supplied to an adder 62, and an output $(T_B+\Delta)$ of the adder 62 is supplied to an adder 63. On the other hand, the output $(D_i-D_0)$ of the subtracter 55 is multiplied by K in a constant multiplier 64 and then supplied to the adder 63 and an output $\{T_B+\Delta+K(D_i-D_0)\}$ of the adder 63 is supplied as the reference temperature $T_0$ to the temperature adjuster 65. The temperature pattern corrector 61 is used to manually correct the temperature pattern, and, for example, outputs the voltage $\Delta$ proportional to the rotation angle of a dial when the dial is turned. The operator turns the dial when the control deviation $(D_i-D_0)$ is large.

The temperature adjuster 65 performs, for example, PID control on the electric power supplied to the heater 24 through a heater driver 66 so that the control deviation $(T_i-T_0)$ of the detected temperature $T_i$ from the radiation thermometer 48 and the reference temperature $T_0$ from the adder 63 approaches 0.

The outputs $T_i$, $D_0$, $D_i$ and $T_B+\Delta$ from the radiation thermometer 48, the reference diameter pattern generator 52, the diameter measurer 54 and the adder 62 respectively are supplied to a data recording device 68. The crucible rotational speed $CR_i$ and the Si single crystal pull-up speed $V_i$ are also supplied to the data recording device 68 from rotary encoders 69 and 70, respectively, and furthermore, the length L of the body is supplied. The data recording device 68 records these data corresponding to the length L of the body as operational data.

Figure 2:
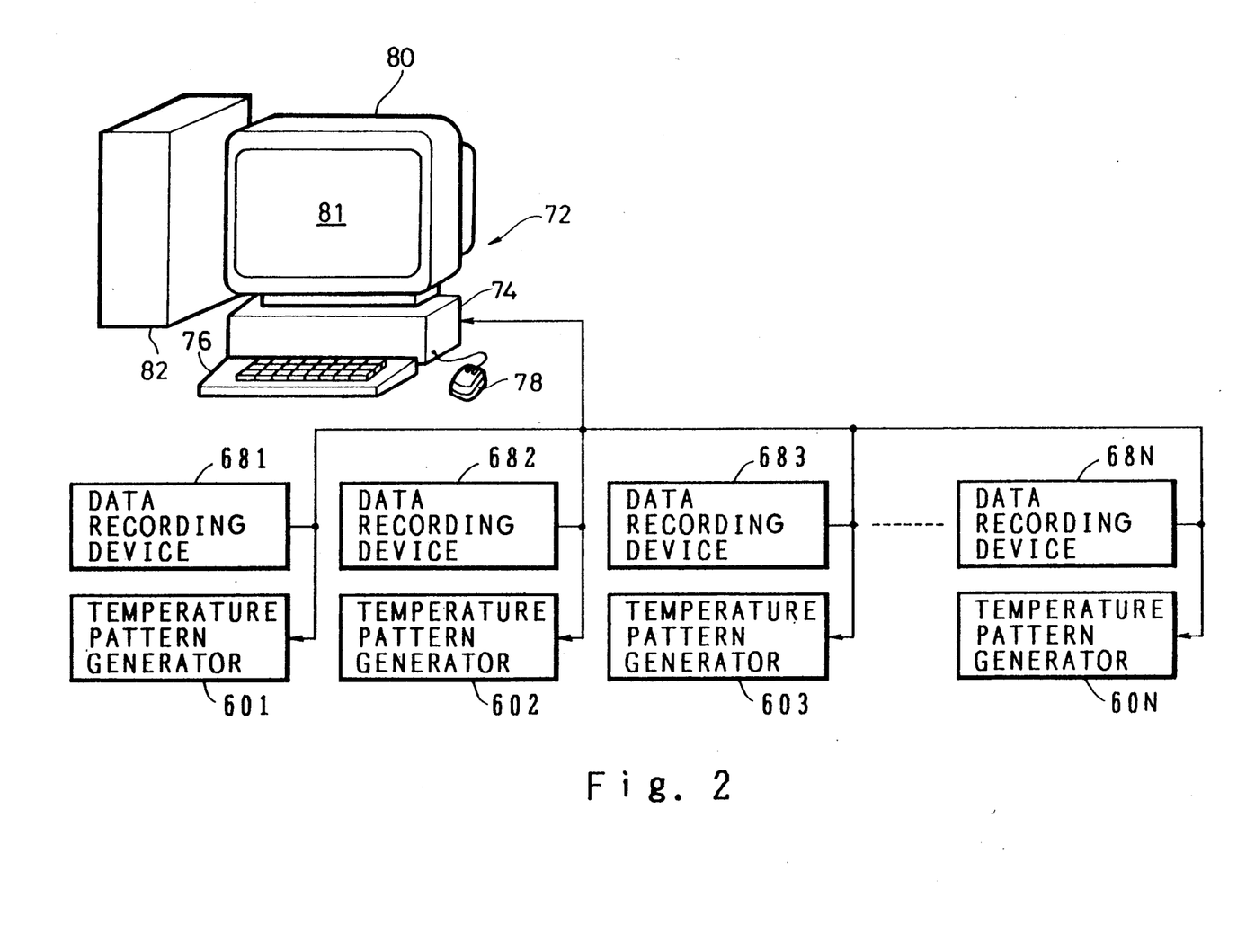
FIG. 2 is a view showing the composition of hardware for setting a temperature pattern and the related devices.

There are N number of Si single crystal pulling apparatuses having the above-mentioned composition. The temperature pattern generators 60 in the apparatuses are denoted by 601, 602, ..., 60N, respectively, and the data recording devices 68 in the apparatuses are denoted by 681, 682, ..., 68N, respectively. As shown in FIG. 2, input terminals of the temperature pattern generators 601 to 60N and output terminals of the data recording devices 681 to 68N are connected in common to a transmission path 71 and to a computer 74 of a workstation 72 through the transmission path 71. The hardware composition of the workstation 72 is of a well-known type, that is, a keyboard 76, a mouse 78, a CRT display 80 and a hard disk device 82 are connected to the computer 74.

Each of the data recording devices 681 to 68N has an ID code, and, for example, when the ID code and a transmission request are output from the data recording device 682 to the transmission path 71, if the computer 74 is ready, the computer 74 outputs an acknowledge signal and the ID code of the data recording device 682 to the transmission path 71. The data recording device 682 receives the acknowledge signal and the ID code and outputs its own ID code, the name of the single crystal pulling apparatus, the date when the data was collected, the batch number and the above operational data to the transmission path 71, and the computer 74 receives these data as data from the data recording device 682. On the other hand, the temperature pattern is formed by operating the keyboard 76 and the mouse 78 as described below, and an ID code of the data recording device 682 and the temperature pattern are output from the computer 74 to the transmission path 71. If the output ID code corresponds to the above own ID code, each of the temperature pattern generators 601 to 60N reads and stores the temperature pattern. Thus, the temperature pattern is set in the temperature pattern generator 60.

Procedures for forming the temperature pattern will now be described.

Figure 3:
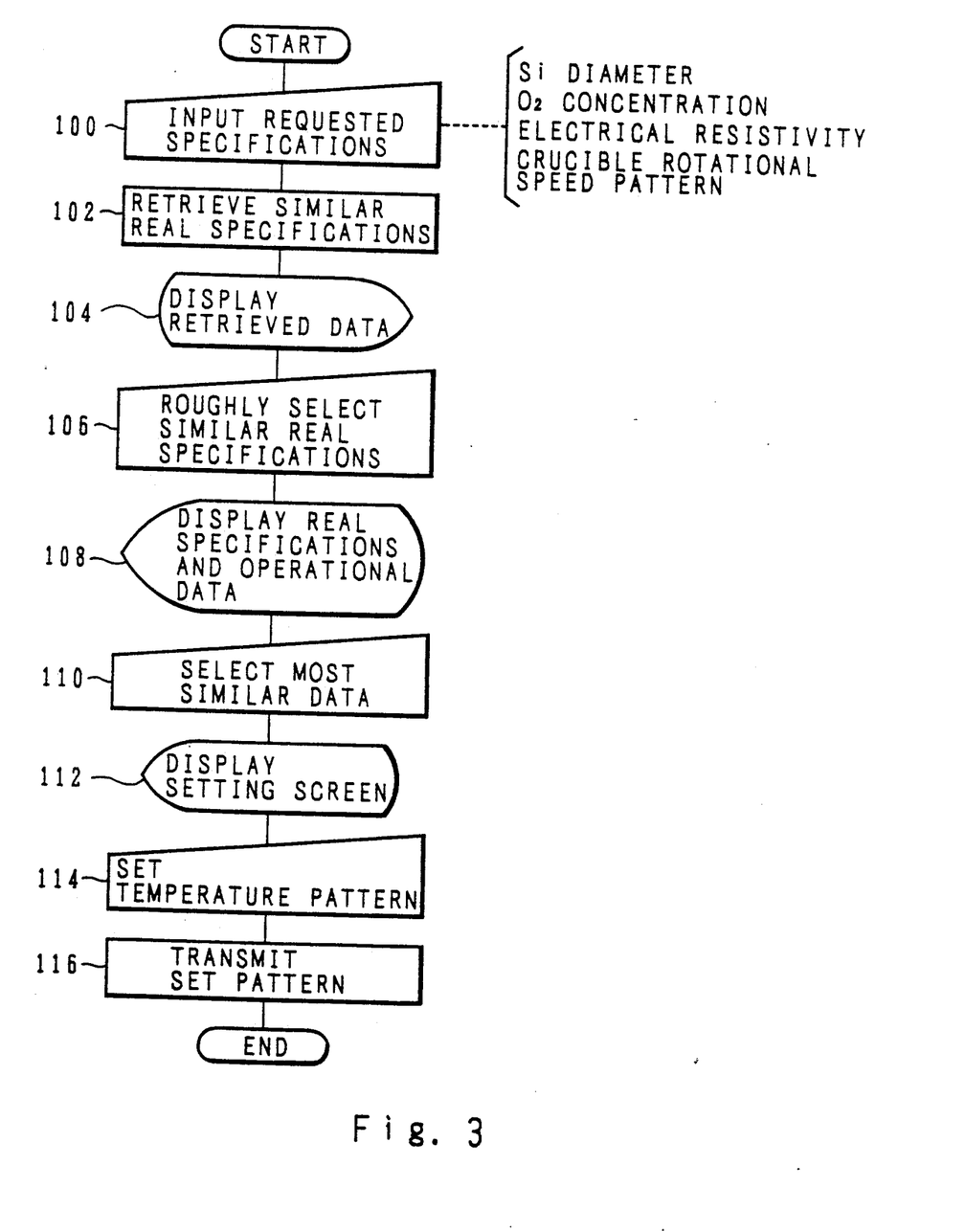
FIG. 3 is a flowchart showing procedures of setting the temperature pattern.
Figure 4:
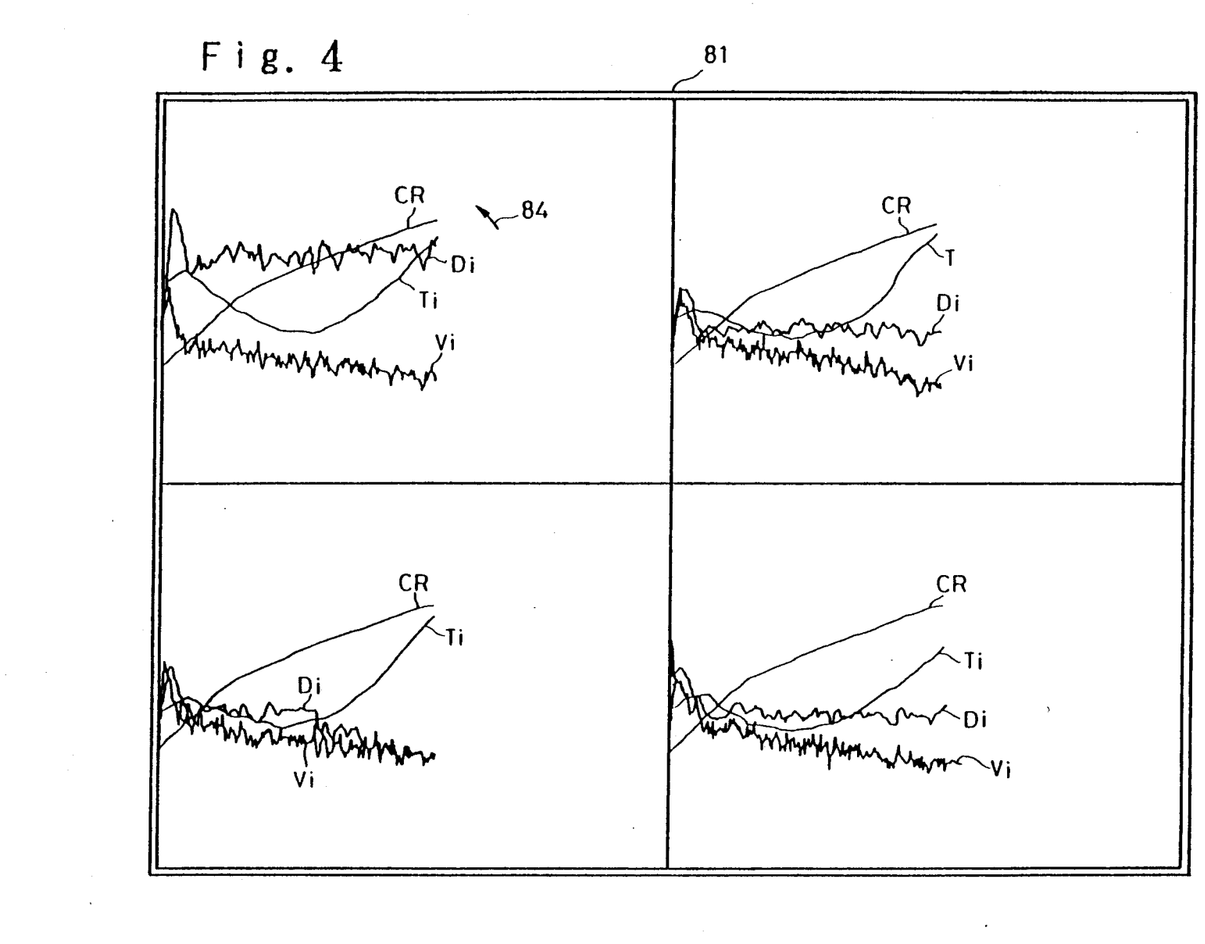
FIG. 4 is a view showing a screen with patterns displayed in Step 108 shown in FIG. 3.
Figure 5:
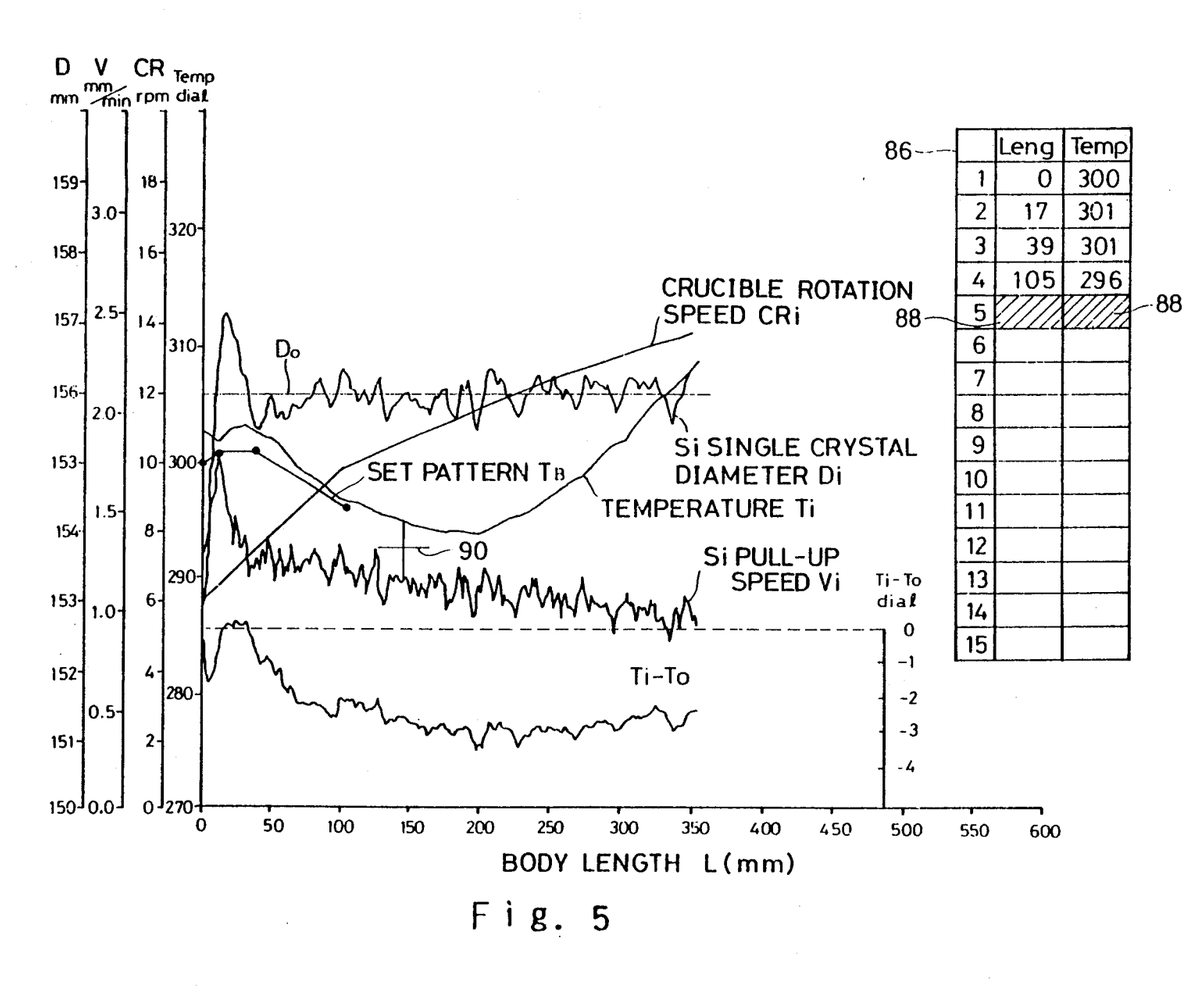
FIG. 5 is a view showing a screen with patterns displayed in Step 112 shown in FIG. 5.

FIG. 3 shows these procedures, and FIGS. 4 and 5 show images displayed on a screen 81 of the CRT display 80 when forming the temperature pattern.

(100) The keyboard 76 is operated so as to input requested specifications, such as the reference diameter $D_0$ of the body of the Si single crystal 36, the concentration of oxygen and the electrical resistivity, and the pattern $CR_0(L)$ of the crucible rotational speed to meet these specifications. The pattern may be formed and input by retrieving the data stored in the hard disk device 82 in the same manner as a method of forming the temperature pattern described below.

(102) Past actual specifications (quality test results) are stored in the hard disk device 82, corresponding to the operational data from the data recording devices 681 to 68N. The computer 74 compares the data input in Step 100 with the data stored in the hard disk device 82 and automatically retrieves similar data. In this retrieval, for example, a well-known method, in which the degree of similarity is defined by using the least square approximation method and calculated in the stored data, can be used.

(104) A fixed number of the retrieved data are displayed in a list on the CRT display 80 in order of degree starting from the data having the highest degree.

(106) An operator roughly selects, based on his own judgement, a plurality of pairs of data which are similar to the pair of data input in Step 100 from the data list by operating the mouse 78 (although only one pair may be selected, a plurality of pairs are generally selected).

(108) Then, in order to facilitate the selection, the screen 81 of the CRT display 80 is divided into, for example, four divisions as shown in FIG. 4, and the selected four pairs of the actual specifications and the operational data relative to the specifications are simultaneously displayed in graphs. Referring to FIG. 4, the display of the name of the pulling apparatus, the actual specifications and so on is omitted.

(110) Numeral 84 denotes a mouse arrow cursor. The operator selects the most similar pair of data by operating the mouse 78 and designating any of the divisions in the whole screen.

(112) Thereby, a setting screen is displayed as shown in FIG. 5. The graphs shown in FIG. 5 are enlarged graphs of the operational data when the upper left division shown in FIG. 4 is selected. Table 86 is displayed on the right side of the graphs and has a column (Leng) showing the lengths L of the body of the single crystal and a column (Temp) showing the corresponding set temperatures $T_B$. A cursor 88 is displayed at a position in which the next length and set temperature data will be input in both columns.

(114) As shown in FIG. 5, the diameter $D_i$ changes relatively sharply where L=approximately 25 mm. This change is attended by a relatively sharp change in the pull-up speed $V_i$. Since, when the pull-up speed $V_i$ sharply changes, defects in the crystal are caused, the temperature pattern $T_B$ is set based on experiments with reference to the temperature patterns $T_i$ and $T_i-T_0$ in order to prevent these defects. In this case, it is necessary to consider the crucible rotational speed $CR_i$ as described above. The temperature pattern $T_B$ is set for other divisions in the same manner as the above.

The setting is performed as follows: a mouse cross cursor 90 is displayed on the graphs and coordinates (L, $T_B$) are designated by operating the mouse 78. Thereby, the values of the selected L and $T_B$ are displayed at the position the cursor 88. Thus, the temperature pattern $T_B$ (L) is easily set. When the setting is completed, (116) the computer 74 transmits an ID code of one of the temperature pattern generators 601 to 60N, which corresponds to the set temperature pattern, in a set of the coordinates (L, $T_B$) to the temperature pattern device. The temperature pattern generator outputs the temperature pattern linking designated adjoining points through a straight line.

As described above, a preferable temperature pattern can be formed easily and quickly.

What is claimed is:

1. A method of forming a temperature pattern comprising:
    (1) automatically collecting operational data from a control apparatus for pulling a Si single crystal up from Si molten liquid melt by a heater in a crucible, said apparatus comprising:
        a device for taking a picture of the vicinity of a growing portion of said Si single crystal and outputting image signals;
        a device for processing the image signals and measuring a diameter Di of said growing portion;
        means for setting a reference pattern $D_0(X)$ of the diameter as a function of a pull-up distance X of said Si single crystal from a certain growth point;
        a motor for pulling said Si single crystal up;
        means for controlling a rotational speed of said motor so that a deviation of the diameter approaches zero;
        means for detecting a temperature $T_1$ representative of the temperature of said heater;
        means for setting a temperature pattern $T_B(X)$ as a function of the pull-up distance X;
        means for outputting the sum of a value related to the diameter deviation and an output value of said temperature pattern setting means as the reference temperature;
        means for controlling electric power supplied to said heater so that the detected temperature approaches to a reference temperature; and
        means for detecting a rotational speed $CR_1$ of said crucible;
    (2) storing the collected data and data related to the quality of said Si single crystal in a memory device;
    (3) retrieving data similar to the quality of a Si single crystal to be produced from the stored data by using a computer;
    (4) displaying the retrieved data on a screen of a display unit and selecting data which seem to be most similar from displayed data;
    (5) displaying details of the selected data in a graph on the screen for setting a temperature pattern; and
    (6) setting the temperature pattern while watching said setting screen.

2. A method according to claim 1, wherein said graph in said step (5) contains a rectangular coordinate plane on which lines of said detected temperature $T_1$, a temperature deviation $T_1-T_0$, said measured diameter $D_1$, said reference pattern $D_0(X)$ of said diameter, pull-up speed $V_1$ which is proportional to said rotational speed of said motor and said rotational speed $CR_1$ are superposed versus common axis of pull-up distance X of said Si single crystal, wherein said temperature pattern is set on said coordinate plane.

3. A method according to claim 2, wherein said step (4) comprises the steps of:
    (4a) displaying the retrieved data in said display unit;
    (4b) letting said operator select a plurality of sets of data, which seem to be the most similar, from the displayed data;
    (4c) displaying details of each of the selected plurality of sets of data in a graph on each of divided screens of said display unit; and
    (4d) letting said operator select the divided screen on which the most similar data of the data is displayed.

4. A method according to claim 3, wherein said graph in said step (4c) contains rectangular coordinate plane on which lines of said detected temperature $T_1$, a temperature deviation $T_1 - T_0$, said measured diameter $D_1$, said reference pattern $D_0(X)$ of said diameter, pull-up speed $V_1$ which is proportional to said rotational speed of said motor and said rotational speed $CR_1$ are superposed versus common axis of pull-up distance X of said Si single crystal.

5. A method according to claim 2, wherein a temperature pattern $T_B(X)$ is displayed on said coordinate plane by setting a plurality of coordinates $(X, T_B)$ constituting the temperature pattern by a mouse in said step (6).

6. A method according to claim 2, wherein the value related to the diameter deviation is a value proportional to the diameter deviation.

7. A method according to claim 2, wherein said control apparatus, further comprising means for outputting a value which is manually set, wherein said reference temperature supply means supplies the sum of the value related to the diameter deviation, the output value of said temperature pattern setting means and the manually set value as the reference temperature.

8. A method according to claim 7, wherein said value related to the diameter deviation is a value proportional to the diameter deviation.

* * * * *